United States Patent
Kwon et al.

(10) Patent No.: US 11,405,009 B2
(45) Date of Patent: Aug. 2, 2022

(54) RF AMPLIFIER INCLUDING GAIN/PHASE COMPENSATOR

(71) Applicant: KNU-INDUSTRY COOPERATION FOUNDATION, Gangwon-do (KR)

(72) Inventors: Kuduck Kwon, Seoul (KR); Donggu Lee, Gangwon-do (KR)

(73) Assignee: KNU-INDUSTRY COOPERATION FOUNDATION, Gangwon-do (KR)

(*) Notice: Subject to any disclaimer, the term of this patent is extended or adjusted under 35 U.S.C. 154(b) by 80 days.

(21) Appl. No.: 17/077,616

(22) Filed: Oct. 22, 2020

(65) Prior Publication Data

US 2021/0135642 A1 May 6, 2021

(30) Foreign Application Priority Data

Nov. 6, 2019 (KR) .................. 10-2019-0141108

(51) Int. Cl.
*H03F 1/32* (2006.01)
*H03F 3/68* (2006.01)
*H03F 3/195* (2006.01)

(52) U.S. Cl.
CPC .............. *H03F 3/68* (2013.01); *H03F 3/195* (2013.01); *H03F 2200/171* (2013.01); *H03F 2200/294* (2013.01); *H03F 2200/451* (2013.01)

(58) Field of Classification Search
CPC .............................. H03F 1/3223; H03F 1/3241
USPC .................................................. 330/151, 149
See application file for complete search history.

(56) References Cited

U.S. PATENT DOCUMENTS

| | | | |
|---|---|---|---|
| 6,339,701 B1 * | 1/2002 | Myer | H03D 7/165 455/313 |
| 6,429,738 B1 * | 8/2002 | Kenington | H03F 1/3247 330/151 |
| 6,489,844 B2 | 12/2002 | Akira et al. | |
| 7,466,965 B2 * | 12/2008 | Tanabe | H03F 1/0205 375/302 |
| 9,287,829 B2 * | 3/2016 | Nobbe | H03F 1/0227 |
| 10,498,382 B2 * | 12/2019 | Laskar | G06F 13/42 |
| 10,797,738 B2 * | 10/2020 | Shanan | H04B 1/10 |
| 2009/0061805 A1 | 3/2009 | Kim et al. | |

FOREIGN PATENT DOCUMENTS

| | | |
|---|---|---|
| KR | 19980070303 A | 10/1998 |
| KR | 20010062168 A | 7/2001 |
| KR | 20090025112 A | 3/2009 |
| KR | 20160100409 A | 8/2016 |

* cited by examiner

*Primary Examiner* — Henry Choe
(74) *Attorney, Agent, or Firm* — Heslin Rothenberg Farley & Mesiti P.C.

(57) ABSTRACT

Disclosed is a radio frequency (RF) amplifier having channel selectivity. The RF amplifier includes a main path including an amplifier, and a feedforward path including a gain/phase compensator, a high-pass filter, and a mixer.

9 Claims, 7 Drawing Sheets

RF AMPLIFIER INCLUDING GAIN/PHASE COMPENSATOR

CROSS-REFERENCE TO RELATED APPLICATION(S)

This application claims the benefit of Korean Patent Application No. 10-2019-0141108, filed on Nov. 6, 2019, in the Korean Intellectual Property Office, the disclosure of which is incorporated herein by reference.

BACKGROUND

1. Field of the Invention

One or more example embodiments relate to a radio frequency (RF) amplifier including a gain/phase compensator.

2. Description of the Related Art

Wireless transceivers are widely used in wireless communication systems. A wireless transceiver generally includes a wireless receiver for receiving and demodulating a signal and a wireless transmitter for modulating and transmitting a signal.

The wireless receiver may receive signals including desired signals and blockers or undesired signals in some cases. The receiver may amplify the desired signals and filter out the blockers through an RF device.

The conventional wireless communication systems have generally used a surface acoustic wave (SAW) filter to separate desired signals from blocker signals at radio frequencies. Since the SAW filter is not an on-chip filter in a semiconductor device, but an external filter, removing blocker signals using the SAW filter may increase the cost of the wireless transceiver. In particular, since a transceiver having a multi-band structure requires a separate SAW filter for each frequency band, the cost of the wireless transceiver may further increase.

SUMMARY

Example embodiments may improve the blocker filtering performance of a radio frequency (RF) amplifier having channel selectivity by adjusting a gain and a phase of a feedforward path having a notch removal characteristic.

According to an aspect, there is provided a radio frequency (RF) amplifier including a main path including an amplifier, and a feedforward path including a gain/phase compensator, a high-pass filter, and a mixer.

The gain/phase compensator may be configured to adjust a gain of the feedforward path based on a gain of the amplifier and to adjust a phase of an output of the feedforward path based on a phase of an output of the amplifier.

The gain/phase compensator may be configured to adjust the gain of the feedforward path or the phase of the output of the feedforward path based on a frequency band of a blocker.

The gain/phase compensator may include a plurality of variable gain amplifiers.

The gain/phase compensator may include a first amplifier with a first input terminal and a second input terminal respectively coupled to a positive (+) component input terminal and a negative (−) component input terminal of a first input signal and with a first output terminal and a second output terminal respectively coupled to a positive (+) component output terminal and a negative (−) component output terminal of a first output signal, a second amplifier with a first input terminal and a second input terminal respectively coupled to the positive (+) component input terminal and the negative (−) component input terminal of the first input signal and with a first output terminal and a second output terminal respectively coupled to a negative (−) component output terminal and a positive (+) component output terminal of a second output signal, a third amplifier with a first input terminal and a second input terminal respectively coupled to a positive (+) component input terminal and a negative (−) component input terminal of a second input signal and with a first output terminal and a second output terminal respectively coupled to the positive (+) component output terminal and the negative (−) component output terminal of the first output signal, and a fourth amplifier with a first input terminal and a second input terminal respectively coupled to the positive (+) component input terminal and the negative (−) component input terminal of the second input signal and with a first output terminal and a second output terminal respectively coupled to the positive (+) component output terminal and the negative (−) component output terminal of the second output signal.

The amplifier may include a low-noise amplifier (LNA) or a low-noise transconductance amplifier (LNTA).

The amplifier may include a common-gate amplifier having an LC tank.

The mixer may include an up-conversion mixer and a down-conversion mixer.

One end of the down-conversion mixer may be coupled to an input terminal of the amplifier, one end of the gain/phase compensator may be coupled to the other end of the down-conversion mixer, one end of the high-pass filter may be coupled to the other end of the gain/phase compensator, one end of the up-conversion mixer may be coupled to the other end of the high-pass filter, and the other end of the up-conversion mixer may be coupled to an output terminal of the amplifier.

The up-conversion mixer and the down-conversion mixer may be coupled to a local oscillator.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail with reference to the accompanying drawings. However, various alterations and modifications may be made to the example embodiments. Here, the example embodiments are not construed as limited to the disclosure. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Terms, such as first, second, and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Figure 1:
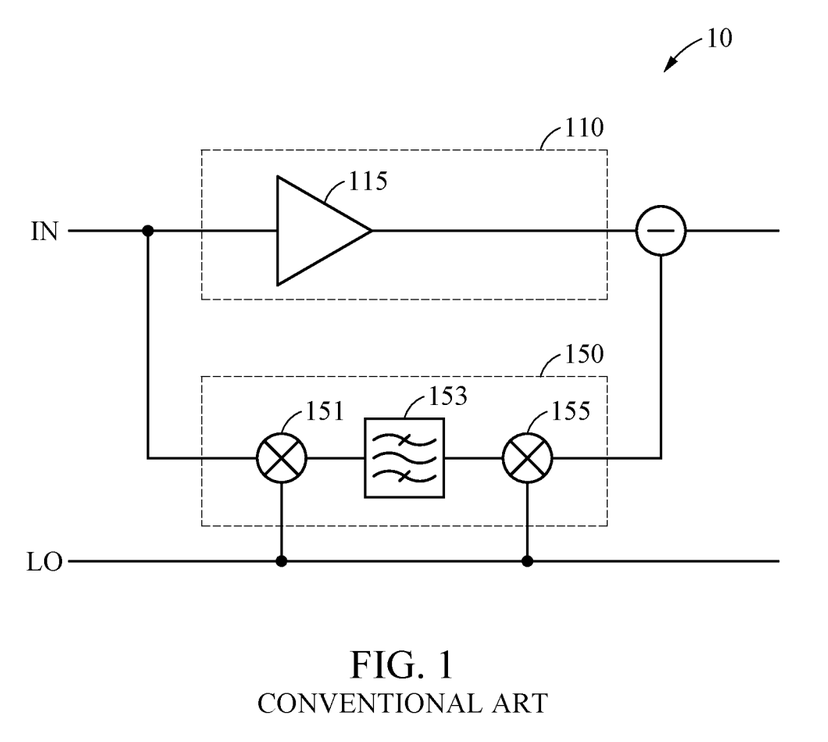
FIG. 1 illustrates an example of a conventional radio frequency (RF) amplifier having channel selectivity, implemented using a feedforward path.
Figure 2A:
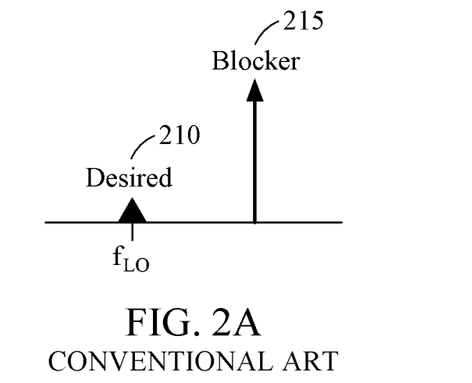
FIGS. 2A to 2C are graphs for describing an operation of an RF amplifier having channel selectivity.
Figure 2B:
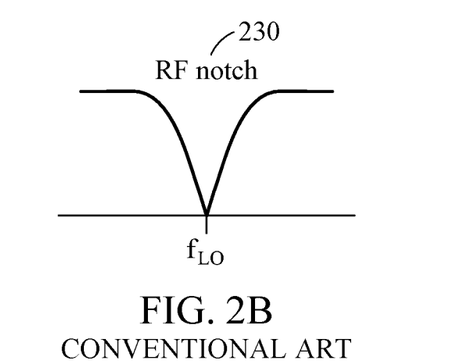
Figure 2C:
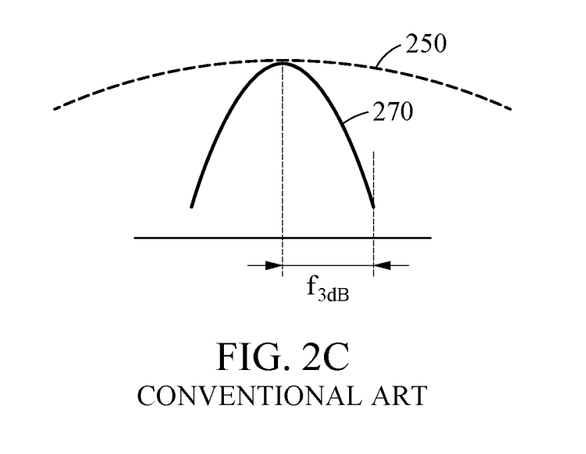

FIG. 1 illustrates an example of a conventional radio frequency (RF) amplifier having channel selectivity, implemented using a feedforward path, and FIGS. 2A to 2C are graphs for describing an operation of the RF amplifier having channel selectivity.

An RF amplifier 10 may be implemented to have channel selectivity using a feedforward path 150.

The RF amplifier 10 may amplify a received signal. In this case, the received signal may include a blocker 215, and the RF amplifier 10 may separate the blocker 215 from a desired signal 210 and amplify only the desired signal 210.

The RF amplifier 10 may include a main path 110 and the feedforward path 150. The main path 110 may include an amplifier 115, and the feedforward path 150 may include mixers 151 and 155 and a high-pass filter 153.

The amplifier 115 may be implemented as a low-noise amplifier (LNA) having a gain in a reception frequency band and/or a low-noise transconductance amplifier (LNTA).

The mixers 151 and 155 may perform frequency conversion. For example, the mixers 151 and 155 may be a down-conversion mixer 151 and an up-conversion mixer 155, respectively.

The mixers 151 and 155 may be connected to a local oscillator (LO).

The high-pass filter 153 may be implemented as an RF notch filter having a notch removal characteristic at a frequency of $f_{LO}$ through frequency conversion using a mixer. For example, the feedforward path 150 may implement a notch filter having a notch removal characteristic by down-converting a signal to a baseband through the down-conversion mixer 151, filtering the down-converted signal through the high-pass filter 153, and up-converting the filtered signal through the up-conversion mixer 155.

FIG. 2B shows a notch removal characteristic 230 at the frequency of $f_{LO}$ implemented through the feedforward path 150.

The RF amplifier 10 may implement a gain 270 having channel selectivity by canceling a gain 230 of the feedforward path 150 from a gain 250 of the main path 110. That is, the RF amplifier 10 may amplify the signal from which the blocker 215 is removed by performing RF band-pass filtering using the notch removal characteristic of the feedforward path 150.

In order for the RF amplifier 10 to perform band-pass filtering, the following two conditions may be required.

The gains of the main path 110 and the feedforward path 150 should be identical, and the phase of the output of the main path 110 and the phase of the output of the feedforward path 150 may need to be identical.

That is, the RF amplifier 10 may improve the performance of removing the blocker 215 by canceling the gain of the feedforward path 150 by the same size from the gain of the main path 110.

Figure 3:
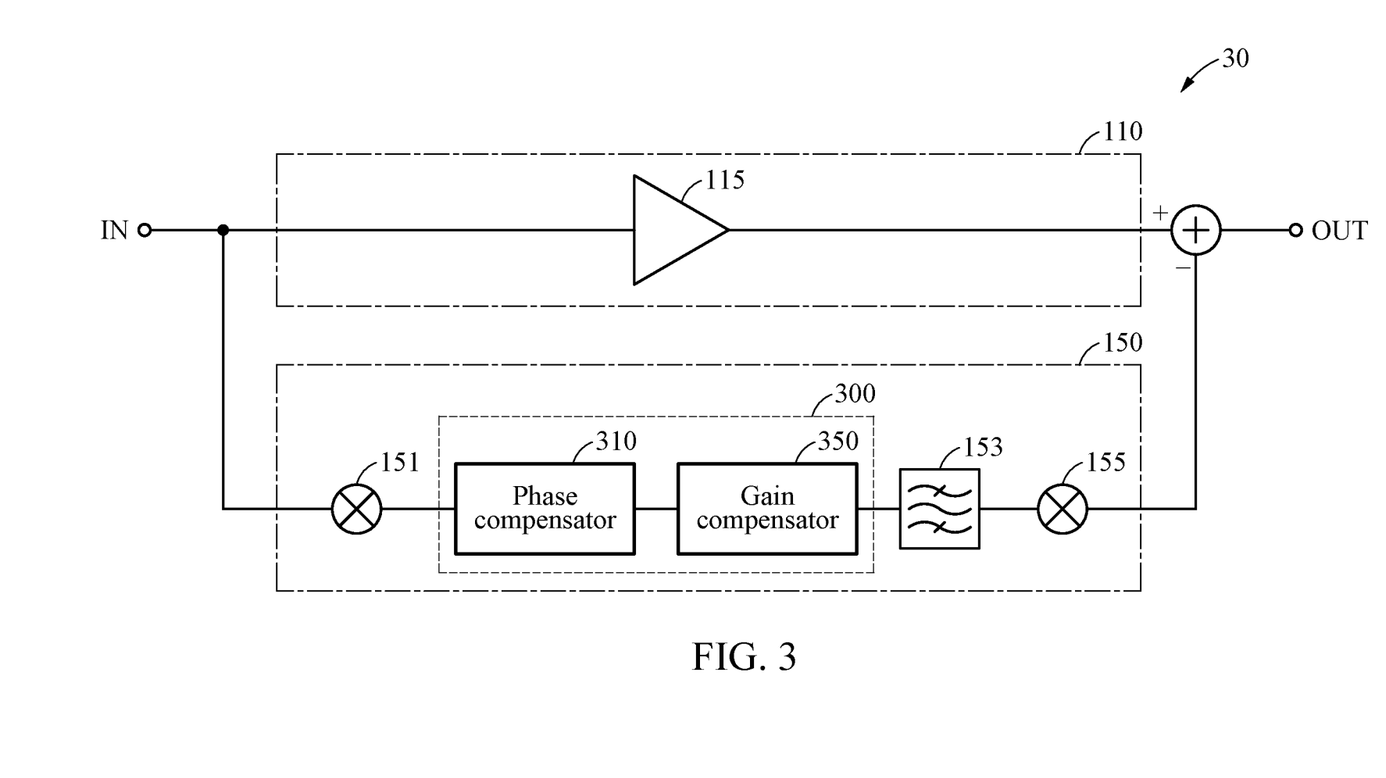
FIG. 3 illustrates an example of an RF amplifier having channel selectivity, in which a gain/phase compensator is implemented on a feedforward path.

FIG. 3 illustrates an example of an RF amplifier having channel selectivity, in which a gain/phase compensator is implemented on a feedforward path.

A feedforward path 150 of an RF amplifier 30 may include a gain/phase compensator 300.

The gain/phase compensator 300 may adjust the gain of the feedforward path 150 to match the gain of the main path 110 and the gain of the feedforward path 150, and adjust the phase of the output of the feedforward path 150 to match the phase of the output of the main path 110 and the phase of the output of the feedforward path 150.

In this example, the gain of the main path 110 and the phase of the output of the main path 110 may be the gain of the amplifier 115 and the phase of the output of the amplifier 115.

The gain/phase compensator 300 may include a phase compensator 310 and a gain compensator 350. Although FIG. 3 illustrates the phase compensator 310 and the gain compensator 350 as separate elements, the phase compensator 310 and the gain compensator 350 may also be implemented as a single element.

The RF amplifier 30 may adjust the gain of the feedforward path 150 and the phase of the output of the feedforward path 150 through the gain/phase compensator 300, thereby improving the blocker removal performance.

The RF amplifier 30 may perform blocker filtering without using bulky off-chip devices, such as a SAW-filter and a duplexer. For example, the RF amplifier 30 may perform blocker filtering through a C-type metal-oxide-semiconductor (CMOS)-integrated LNA.

The RF amplifier 30 may implement an RF notch filter having high selectivity for a desired frequency band in the feedforward path 150 by adding the gain/phase compensator 300 to the feedforward path 150.

The RF amplifier 30 may be implemented as an amplifier capable of performing RF filtering having a high Q-value in an RF frequency band, thereby efficiently removing out-of-band blockers.

The RF amplifier 30 is applicable to a high-performance wireless communication system. For example, the RF amplifier 30 may efficiently remove the out-of-band blockers and transmission leakage signals that cause degradation in the performance of a receiver in a frequency division duplexing (FDD) system for mobile communication.

Figure 4A:
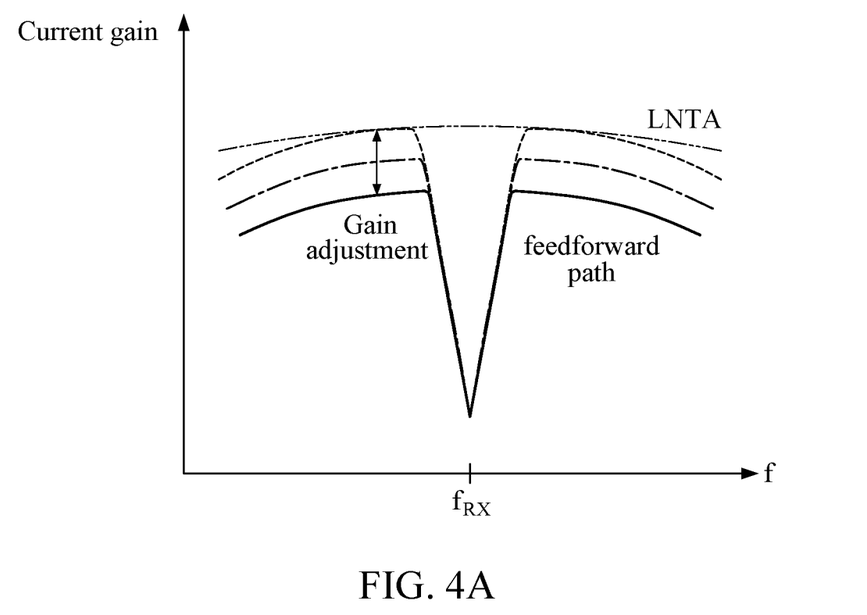
FIGS. 4A to 4C are graphs for describing an operation of the gain/phase compensator of FIG. 3.
Figure 4B:
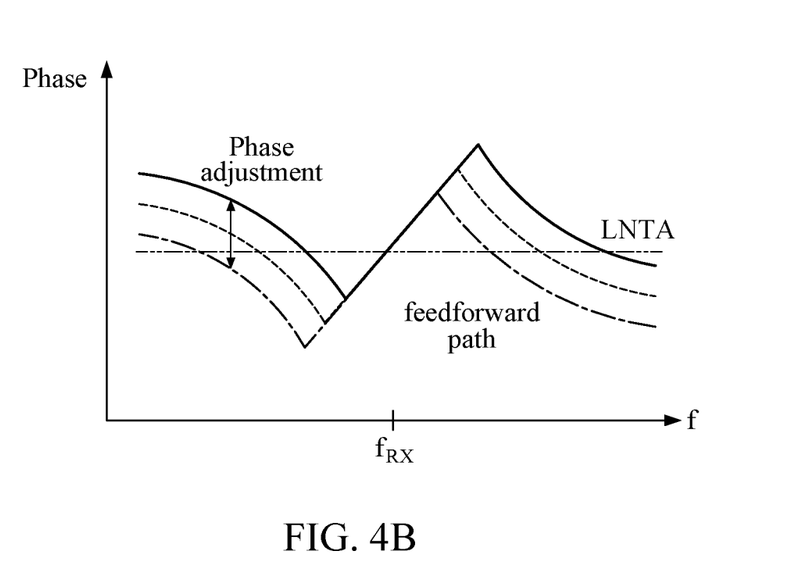
Figure 4C:
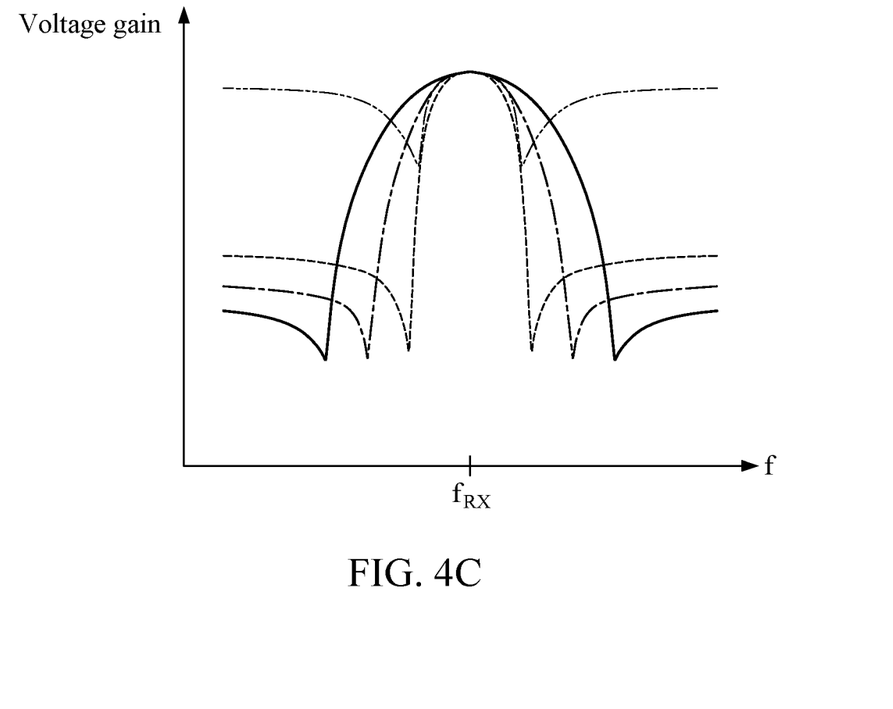

FIGS. 4A to 4C are graphs for describing an operation of the gain/phase compensator of FIG. 3.

FIG. 4A is a graph exemplarily showing the gain of the main path 110 and the gain of the feedforward path 150.

The gain/phase compensator 300 may adjust the gain of the feedforward path 150 to match the gain of the main path 110. For example, the gain/phase compensator 300 may increase the gain of the feedforward path 150 to match the gain of the main path 110.

FIG. 4B is a graph exemplarily showing the phase of the output of the main path 110 and the phase of the output of the feedforward path 150.

The gain/phase compensator 300 may adjust the phase of the output of the feedforward path 150 to match the phase of the output of the main path 110. For example, the gain/phase compensator 300 may delay the phase of the output of the feedforward path 150 to match the phase of the output of the main path 110.

The gain/phase compensator 300 may adjust the phase of the output of the feedforward path 150 based on the frequency band of the blocker 215. For example, the gain/phase compensator 300 may generate a notch at a desired frequency by adjusting the phase of the output of the feedforward path 150 such that the performance of removing the blocker 215 may be maximized.

FIG. 4C is a graph showing the voltage gain of the RF amplifier 30 having channel selectivity.

The gain/phase compensator 300 may adjust the gains and the phases of the main path 110 and the feedforward path 150 such that the RF amplifier 30 may perform notch filtering at a desired frequency, as shown in FIG. 4C.

Figure 5:
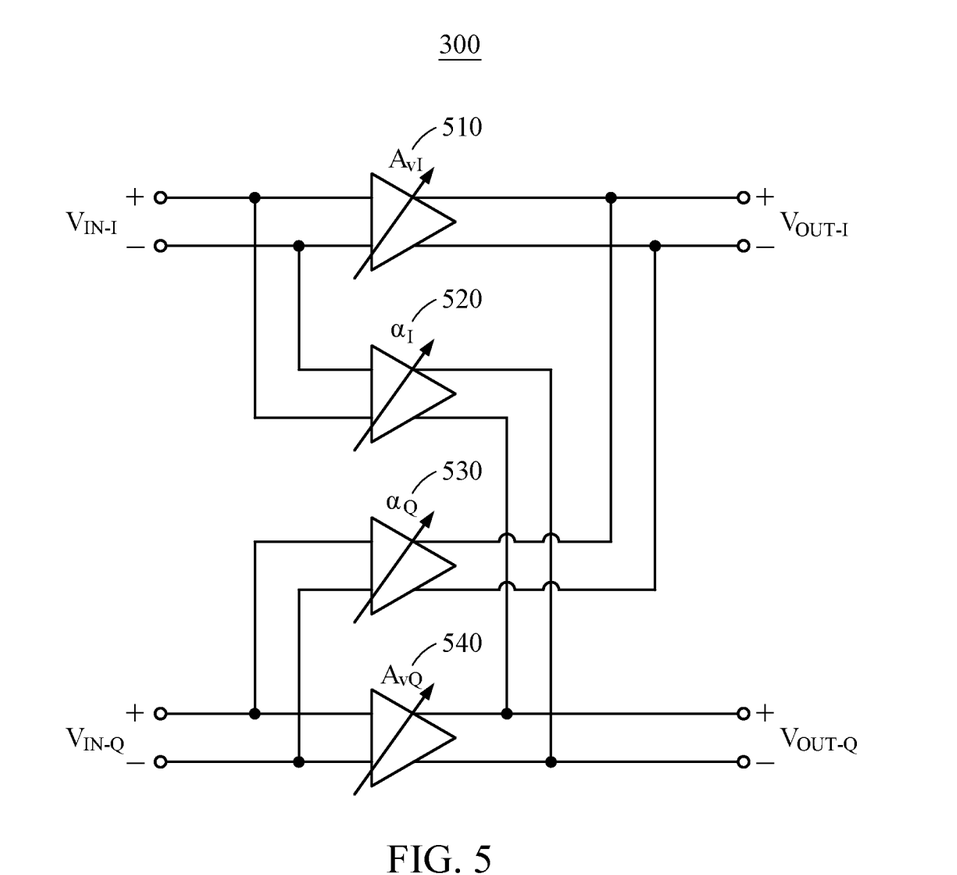
FIG. 5 illustrates an example of a circuit diagram of the gain/phase compensator of FIG. 3.

FIG. 5 illustrates an example of a circuit diagram of the gain/phase compensator of FIG. 3.

The gain/phase compensator 300 may be implemented with a plurality of amplifiers. For example, the gain/phase compensator 300 may be implemented with four variable gain amplifiers.

The gain/phase compensator 300 may include a first amplifier 510, a second amplifier 520, a third amplifier 530, and a fourth amplifier 540. For example, the first to fourth amplifiers 510 to 540 may be variable gain amplifiers.

The gain/phase compensator 300 may generate a first output signal $V_{OUT-I}$ and a second output signal $V_{OUT-Q}$ based on a first input signal $V_{IN-I}$ and a second input signal $V_{IN-Q}$.

For example, the first input signal $V_{IN-I}$ and the second input signal $V_{IN-Q}$ may be an in-phase input signal and a quadrature-phase input signal, respectively, and the first output signal $V_{OUT-I}$ and the second output signal $V_{OUT-Q}$ may be an in-phase output signal and a quadrature-phase output signal, respectively.

A first input terminal and a second input terminal of the first amplifier 510 may be coupled to a positive (+) component input terminal and a negative (−) component input terminal of the first input signal $V_{IN-I}$, respectively. A first output terminal and a second output terminal of the first amplifier 510 may be coupled to a positive (+) component output terminal and a negative (−) component output terminal of the first output signal $V_{OUT-I}$, respectively.

A first input terminal and a second input terminal of the second amplifier 520 may be coupled to the negative (−) component input terminal and the positive (+) component input terminal of the first input signal $V_{IN-I}$, respectively. A first output terminal and a second output terminal of the second amplifier 510 may be coupled to a negative (−) component output terminal and a positive (+) component output terminal of the second output signal $V_{OUT-Q}$, respectively.

A first input terminal and a second input terminal of the third amplifier 530 may be coupled to a positive (+) component input terminal and a negative (−) component input terminal of the second input signal $V_{IN-Q}$, respectively. A first output terminal and a second output terminal of the third amplifier 530 may be coupled to the positive (+) component output terminal and the negative (−) component output terminal of the first output signal $V_{OUT-I}$, respectively.

A first input terminal and a second input terminal of the fourth amplifier 540 may be coupled to the positive (+) component input terminal and the negative (−) component input terminal of the second input signal $V_{IN-Q}$, respectively. A first output terminal and a second output terminal of the fourth amplifier 540 may be coupled to the positive (+) component output terminal and the negative (−) component output terminal of the second output signal $V_{OUT-Q}$, respectively.

The gains of the first amplifier 510, the second amplifier 520, the third amplifier 530, and the fourth amplifier 540 may be $A_{vI}$, $a_I$, $a_Q$, and $A_{vQ}$, respectively.

The first input signal $V_{IN-I}$ and the second input signal $V_{IN-Q}$ may be expressed by Equations 1 and 2, respectively.

$$V_{IN-I} = R_I + jX_I \qquad \text{[Equation 1]}$$

$$V_{IN-Q} = R_Q + jX_Q \qquad \text{[Equation 2]}$$

In this case, the first output signal $V_{OUT-I}$ and the second output signal $V_{OUT-Q}$ generated by the gain/phase compensator 300 may be expressed by Equations 3 and 4, respectively.

$$\begin{aligned} V_{OUT-I} &= A_{vI}(R_I + jX_I) + a_Q(R_Q + jX_Q) \\ &= (A_{vI}R_I + a_Q R_Q) + j(A_{vI}X_I + a_Q X_Q) \end{aligned} \qquad \text{[Equation 3]}$$

$$\begin{aligned} V_{OUT-Q} &= A_{vQ}(R_Q + jX_Q) + a_I(R_I + jX_I) \\ &= (A_{vQ}R_Q + a_I R_I) + j(A_{vQ}X_Q + a_I X_I) \end{aligned} \qquad \text{[Equation 4]}$$

The gain/phase compensator 300 may adjust the gains ($A_{vI}$, $a_I$, $a_Q$, and $A_{vQ}$) of the first to fourth amplifiers 510 to 540 to match the gains and the phases of the main path 110 and the feedforward path 150 at a specific frequency.

Figure 6:
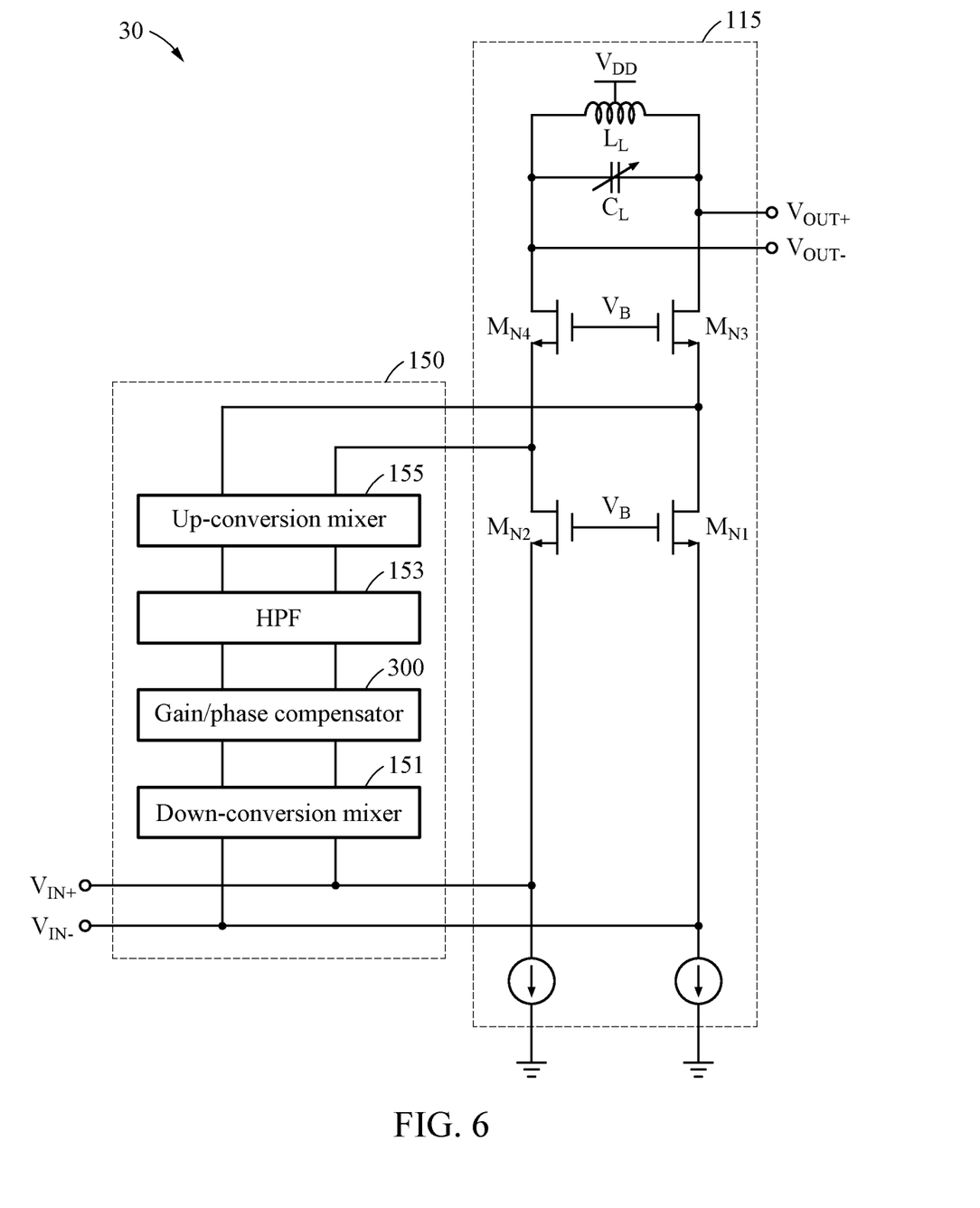
FIG. 6 illustrates an example of a circuit diagram of the RF amplifier of FIG. 3.

FIG. 6 illustrates an example of a circuit diagram of the RF amplifier of FIG. 3.

The amplifier 115 of the main path 110 may be implemented as a common-gate amplifier having an LC tank.

For example, the main path 110 may include an inductor $L_L$, a capacitor $C_L$, N-type metal-oxide-semiconductor field-effect transistors (NMOS FETs) $M_{N1}$, $M_{N2}$, $M_{N3}$, and $M_{N4}$, a first current source, and a second current source.

The inductor $L_L$ and the capacitor $C_L$ may be connected in parallel, and both ends of the inductor $L_L$ and the capacitor $C_L$ connected in parallel may be coupled to output terminals $V_{OUT+}$ and $V_{OUT-}$, respectively.

In addition, both ends of the inductor $L_L$ and the capacitor $C_L$ connected in parallel may be coupled to the drains of the NMOS FETs $M_{N3}$ and $M_{N4}$.

The gates of the NMOS FETs $M_{N3}$ and $M_{N4}$ may be coupled to each other, and the sources thereof may be coupled to the drains of the NMOS FETs $M_{N1}$ and $M_{N2}$, respectively.

The gates of the NMOS FETs $M_{N1}$ and $M_{N2}$ may be coupled to each other, and the sources thereof may be coupled to the first current source and the second current source at one ends, respectively.

The other ends of the first current source and the second current source may be grounded.

One end of the feedforward path 150 may be coupled to the sources of the NMOS FETs $M_{N1}$ and $M_{N2}$, and the other end of the feedforward path 150 may be coupled to the drains of the NMOS FETs $M_{N1}$ and $M_{N2}$.

The feedforward path 150 may be implemented by sequentially coupling the down-conversion mixer 151, the gain/phase compensator 300, the high-pass filter 153, and the up-conversion mixer 155 from an input terminal.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A radio frequency (RF) amplifier, comprising:
   a main path including an amplifier; and
   a feedforward path including a gain/phase compensator, a high-pass filter, and a mixer, wherein the gain/phase compensator comprises:
   a first amplifier with a first input terminal and a second input terminal respectively coupled to a positive (+) component input terminal and a negative (−) component input terminal of a first input signal and with a first output terminal and a second output terminal respectively coupled to a positive (+) component output terminal and a negative (−) component output terminal of a first output signal;
   a second amplifier with a first input terminal and a second input terminal respectively coupled to the positive (+) component input terminal and the negative (−) component input terminal of the first input signal and with a first output terminal and a second output terminal respectively coupled to a negative (−) component output terminal and a positive (+) component output terminal of a second output signal;
   a third amplifier with a first input terminal and a second input terminal respectively coupled to a positive (+) component input terminal and a negative (−) component input terminal of a second input signal and with a first output terminal and a second output terminal respectively coupled to the positive (+) component output terminal and the negative (−) component output terminal of the first output signal; and
   a fourth amplifier with a first input terminal and a second input terminal respectively coupled to the positive (+) component input terminal and the negative (−) component input terminal of the second input signal and with a first output terminal and a second output terminal respectively coupled to the positive (+) component output terminal and the negative (−) component output terminal of the second output signal.

2. The RF amplifier of claim 1, wherein the gain/phase compensator is configured to adjust a gain of the feedforward path based on a gain of the amplifier and to adjust a phase of an output of the feedforward path based on a phase of an output of the amplifier.

3. The RF amplifier of claim 2, wherein the gain/phase compensator is configured to adjust the gain of the feedforward path or the phase of the output of the feedforward path based on a frequency band of a blocker.

4. The RF amplifier of claim 1, wherein the gain/phase compensator comprises a plurality of variable gain amplifiers.

5. The RF amplifier of claim 1, wherein the amplifier comprises a low-noise amplifier (LNA) or a low-noise transconductance amplifier (LNTA).

6. The RF amplifier of claim 1, wherein the amplifier comprises a common-gate amplifier having an LC tank.

7. The RF amplifier of claim 1, wherein the mixer comprises an up-conversion mixer and a down-conversion mixer.

8. The RF amplifier of claim 7, wherein one end of the down-conversion mixer is coupled to an input terminal of the amplifier,
   one end of the gain/phase compensator is coupled to the other end of the down-conversion mixer,
   one end of the high-pass filter is coupled to the other end of the gain/phase compensator, and
   one end of the up-conversion mixer is coupled to the other end of the high-pass filter and the other end of the up-conversion mixer is coupled to an output terminal of the amplifier.

9. The RF amplifier of claim 7, wherein the up-conversion mixer and the down-conversion mixer are coupled to a local oscillator.

* * * * *